United States Patent
Lin et al.

(10) Patent No.: US 10,879,443 B2
(45) Date of Patent: Dec. 29, 2020

(54) LED PACKAGE STRUCTURE, CHIP CARRIER, AND METHOD FOR MANUFACTURING CHIP CARRIER

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Yu-Yu Chang, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/547,308

(22) Filed: Aug. 21, 2019

(65) Prior Publication Data
US 2020/0066955 A1     Feb. 27, 2020

(30) Foreign Application Priority Data
Aug. 22, 2018   (CN) .......................... 2018 1 0958371

(51) Int. Cl.
| H01L 33/62 | (2010.01) |
| H01L 33/36 | (2010.01) |
| H01L 33/20 | (2010.01) |
| H01L 33/10 | (2010.01) |
| H01L 23/498 | (2006.01) |

(52) U.S. Cl.
CPC ........ *H01L 33/62* (2013.01); *H01L 23/49838* (2013.01); *H01L 33/10* (2013.01); *H01L 33/20* (2013.01); *H01L 33/36* (2013.01)

(58) Field of Classification Search
CPC ......... H01L 33/62; H01L 33/10; H01L 33/20; H01L 33/36; H01L 23/49838; H01L 23/48–50; H01L 21/043; H01L 21/0485; H01L 24/26–33; H01L 24/02–09; H01L 24/63–70; H01L 2224/05017; H01L 2224/05557; H01L 2224/0603; H01L 2224/29015; H01L 2224/29018; H01L 2224/29019; H01L 2224/29552; H01L 2224/2224; H01L 2224/29553; H01L 2224/32056; H01L 2224/32059; H01L 2224/3207; H01L 2224/63–70; H05K 1/111
See application file for complete search history.

(56) References Cited

U.S. PATENT DOCUMENTS

| 2004/0140571 | A1* | 7/2004 | Tomura | ................... H01L 24/83 257/778 |
| 2012/0115305 | A1* | 5/2012 | Peng | ...................... H01L 24/29 438/455 |

(Continued)

*Primary Examiner* — Scott B Geyer
(74) *Attorney, Agent, or Firm* — Li & Cai Intellectual Property (USA) Office

(57) ABSTRACT

The present disclosure provides an LED package structure, a carrier, and a method for manufacturing a carrier. The carrier includes a substrate and an electrode layer disposed on the substrate. The electrode layer includes at least one bonding portion that has a plurality of elongated microstructures recessed in a surface thereof.

20 Claims, 16 Drawing Sheets

(56) References Cited

U.S. PATENT DOCUMENTS

2015/0311414 A1\* 10/2015 Lin ...................... H01L 33/005
                                                          257/88
2018/0026157 A1\* 1/2018 Gaska ............... H01L 21/02496
                                                          257/753

\* cited by examiner

LED PACKAGE STRUCTURE, CHIP CARRIER, AND METHOD FOR MANUFACTURING CHIP CARRIER

CROSS-REFERENCE TO RELATED PATENT APPLICATION

This application claims the benefit of priority to China Patent Application No. 201810958371.9, filed on Aug. 22, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a carrier, and more particularly to a light emitting diode (LED) package structure, a carrier, and a method for manufacturing a carrier.

BACKGROUND OF THE DISCLOSURE

A conventional carrier includes a substrate and an electrode layer disposed on the substrate, and the electrode layer has a bonding portion configured to fix at least one light emitting chip. However, when the light emitting chip is fixed on the bonding portion through a soldering material, the soldering material may outwardly flow from the bonding portion to other portions of the electrode layer, therefore causing a short circuit in the conventional carrier.

SUMMARY OF THE DISCLOSURE

In response to the above-referenced technical inadequacies, the present disclosure provides an LED package structure, a carrier, and a method for manufacturing a carrier to effectively improve the issues associated with conventional carriers.

In one aspect, the present disclosure provides a carrier, which includes a substrate and an electrode layer having a plurality of metallic pads disposed on a surface of the substrate. A plurality of elongated microstructures recessed or a plurality of accommodating holes formed on a surface of one of bonding portions of the plurality of metallic pads so as chip can be fix well on thereof. In addition, the surface of the bonding portion has an arithmetical mean deviation (Ra) within a range of 0.2-3.5 μm and a ten point height of irregularities (Rz) within a range of 0.8-2.0 μm.

In one aspect, the present disclosure provides a method for manufacturing a carrier thereof and an LED package structure which includes at least one LED chip mounted on thereof via a soldering material. −3.5 μm-2.0 μm Therefore, the LED package structure, the carrier, and the method of the present disclosure include the following advantages. The microstructures of the electrode layer can receive part of the soldering material, thereby preventing the soldering material from flowing to portions of the electrode layer other than the bonding portions. Accordingly, a current short circuit problem brought about by the soldering material can be avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
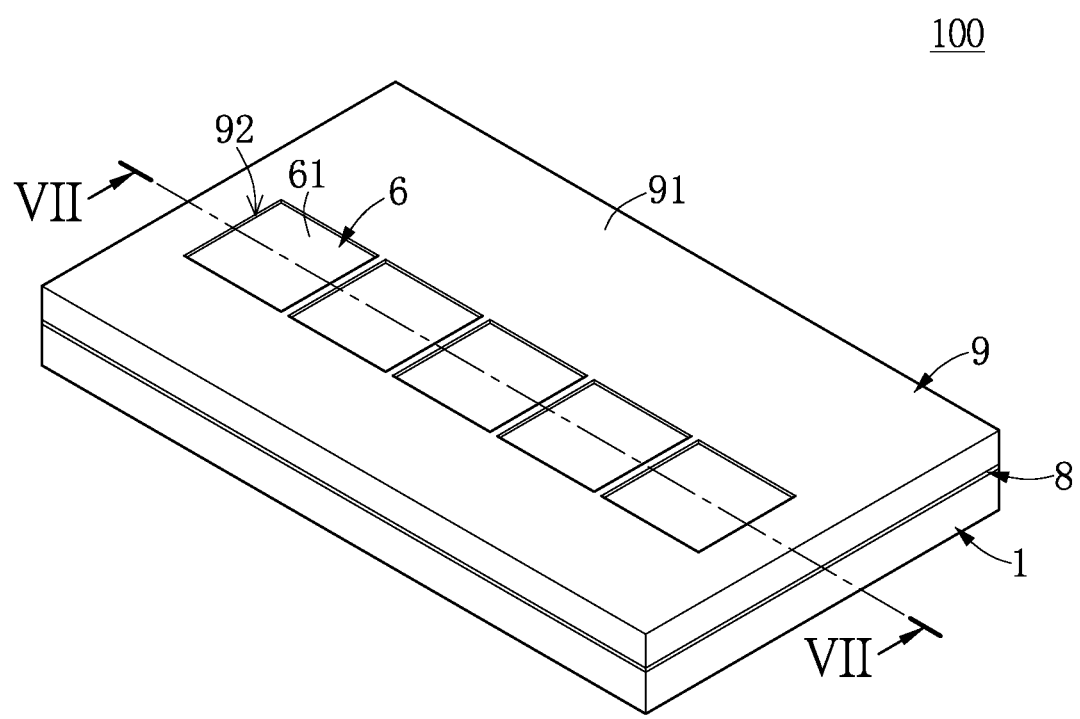
FIG. 1 is a perspective view of an LED package structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 16, an embodiment of the present disclosure provides an LED package structure 100. The LED package structure 100 includes a carrier and a plurality of light-emitting units U formed on the carrier. The carrier has a substrate 1, an electrode layer 2, and an insulating layer 8, the latter two of which are disposed on a surface of the substrate 1. The light-emitting units U have a plurality of LED chips 4 (or light emitting chips). And a reflective housing 9 is disposed on the electrode layer 2 and the insulating layer 8 of the carrier. It should be noted that the electrode layer 2 in the present embodiment (shown in FIG. 8) includes a copper layer 2a and a metallic coating layer 2b (e.g., a nickel-gold layer) formed on the copper layer 2a, but the present disclosure is not limited thereto. The light-emitting units U are fixed on corresponding portions of the electrode layer 2 through a soldering material 7. In order to prevent the soldering material 7 from flowing to other portions of the electrode layer 2, generating a short circuit issue, the electrode layer 2 of the carrier in the present embodiment further includes a plurality of elongated microstructures 25 recessed in a surface thereof arranged away from the substrate 1. In the drawings of the present embodiment, the microstructures 25 are distributed across the entire surface of the electrode layer 2, but the present disclosure is not limited thereto.

Figure 2:
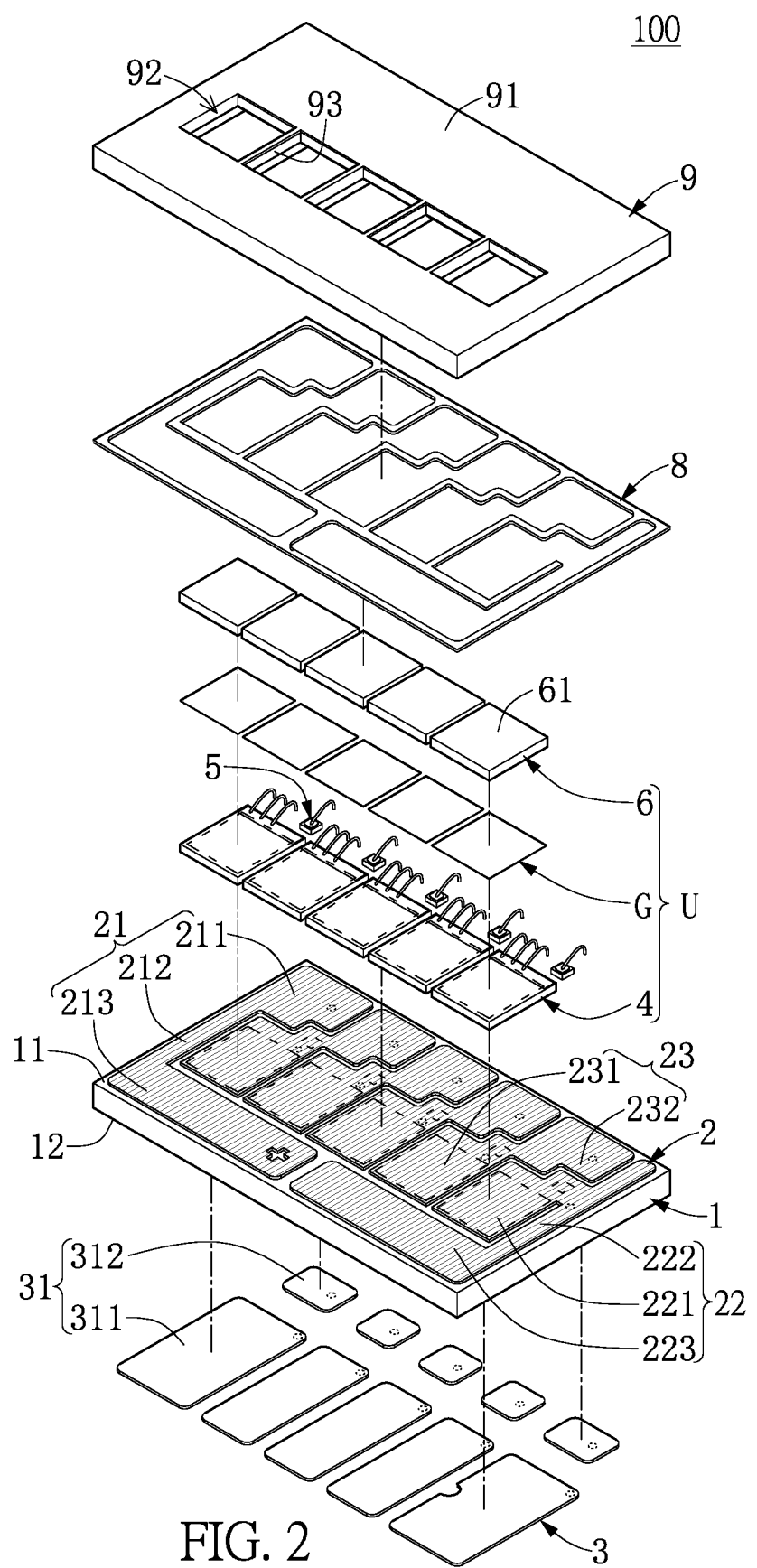
FIG. 2 is an exploded view of FIG. 1.
Figure 3:
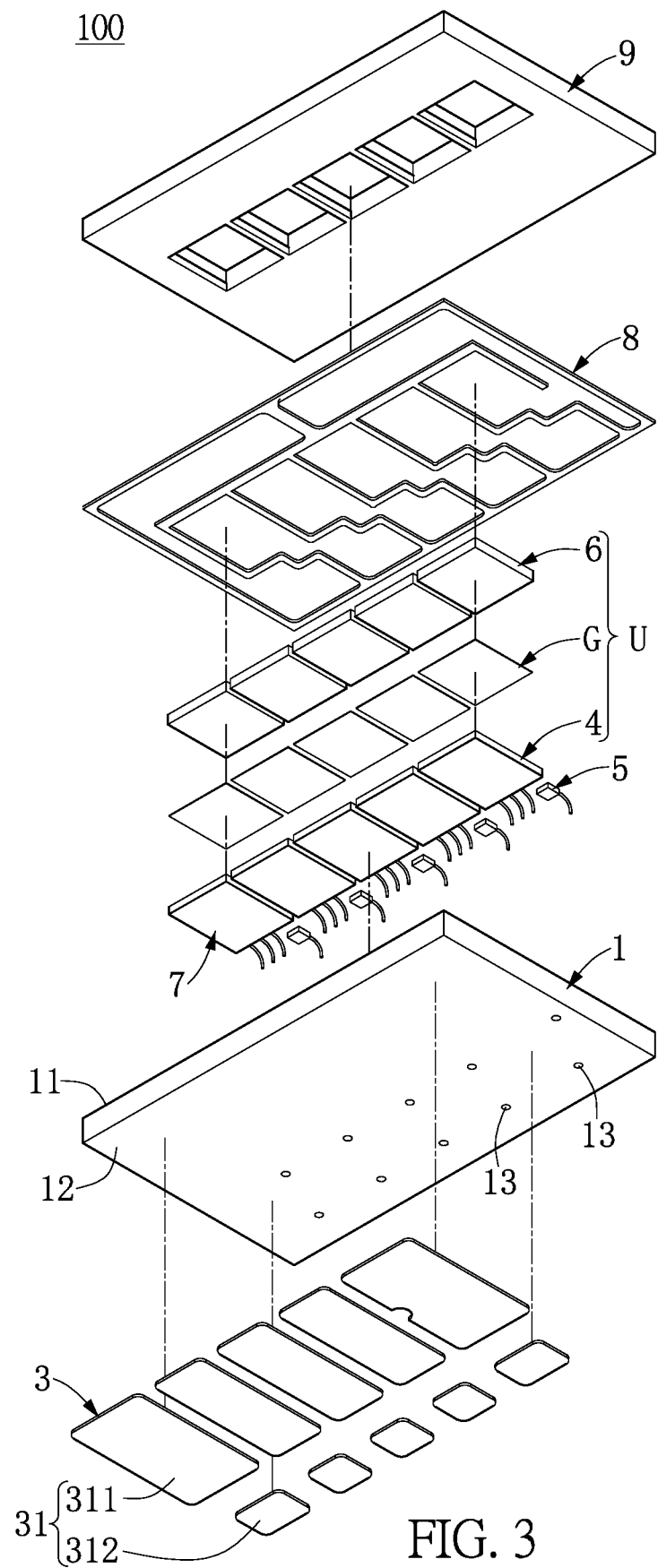
FIG. 3 is an exploded view of FIG. 1 from another angle of view.

As shown in FIG. 2 and FIG. 3, the substrate 1 has a first surface 11 and a second surface 12 opposite to the first surface 11. The carrier further includes a soldering layer 3 disposed on the second surface 12 of the substrate 1 which connected to the electrode layer 2 of the first surface 11 via a plurality of conductive pillars 13 embedded in the substrate 1. The insulating layer 8 is disposed on the first surface 11 of the substrate 1. The insulating layer 8 is complementary in shape to and coplanar with the electrode layer 2. That is to say, the insulating layer 8 is disposed on a portion of the first surface 11 of the substrate 1 where the electrode layer 2 is not disposed, and a side edge of the insulating layer 8 is flush with a side edge of the substrate 1.

Figure 4:
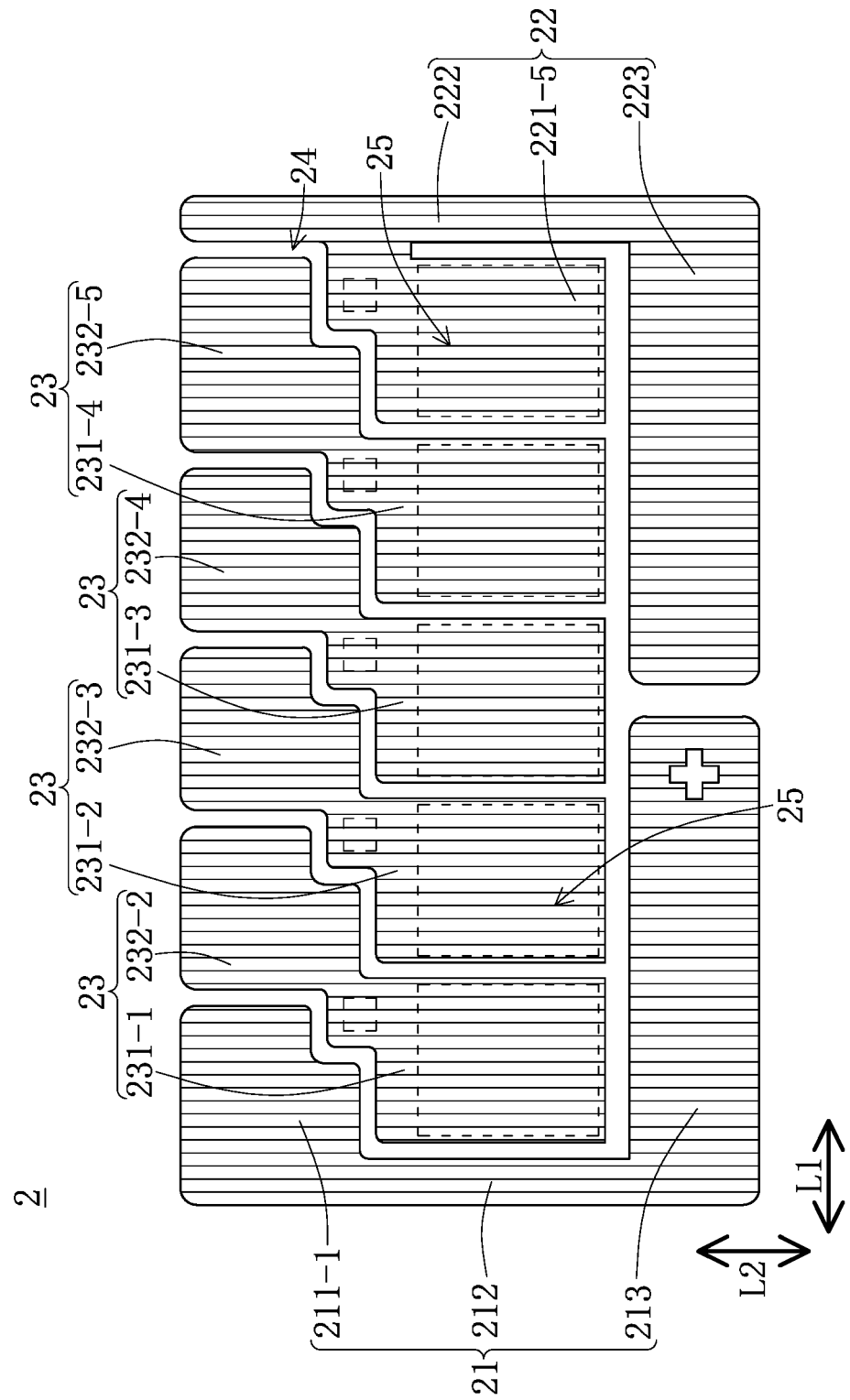
FIG. 4 is a planar view of an electrode layer of the LED package structure according to the embodiment of the present disclosure.

As shown in FIG. 4, the electrode layer 2 includes a first metallic pad 21, a second metallic pad 22, and four third metallic pads 23. The four third metallic pads 23 are spaced apart from each other, and are arranged between the first metallic pad 21 and the second metallic pad 22 in a first direction L1. The microstructures 25 formed on the entire surface the first, second, third metallic pads 21, 22, 23 are substantially parallel to each other and perpendicular to the first direction L1, but the present disclosure is not limited thereto.

The structure and connection relationships of each component of the LED package structure 100 are disclosed in the following description.

The first metallic pad 21 has an L-shaped first wiring portion 211-1, an elongated first extending portion 212, and a rectangular first electrode portion 213. The second metallic pad 22 has an L-shaped bonding portion 221-5, an elongated second extending portion 222, and a rectangular second electrode portion 223. Each of the third metallic pads 23 has an L-shaped bonding portion 231 and an L-shaped wiring portion 232 integrally connected to the bonding portion 231. Each of the bonding portions 221-5, 231-1~231-4 is provided for mounting one of the LED chips 4 and one of the Zener chips 5. Each of the wiring portions 211-1, 232-2~232-5 is provided for wiring one of the LED chips 4 and one of the Zener chips 5.

Further, the bonding portions 231, 221 of the metallic pads 22,23 of the electrode layer 2 are arranged in one row along the first direction L1, the microstructures 25 are substantially parallel to each other, and each of the microstructures 25 is substantially perpendicular to the first direction L1. The surface of each of the bonding portions 231, 221 (or each of the wiring portions 211-1, 232-2~232-5) has an arithmetical mean deviation (Ra) within a range of 0.2-3.5 μm and a ten point height of irregularities (Rz) within a range of 0.8-2.0 μm by forming the microstructures 25. Moreover, in the present embodiment, each of the microstructures 25 is in a straight shape and is substantially perpendicular to the first direction L1. However, in other embodiments of the present disclosure, the microstructure 25 can be in a wave-like shape with a longitudinal direction substantially perpendicular to the first direction L1. In addition, the connection area of the wiring portions 211-1, 232-2~232-5 and the reflective housing 9 in the present embodiment can be increased by forming the microstructures 25 on the wiring portions 211-1, 232-2~232-5, thereby preventing any one of the wiring portions 211-1, 232-2~232-5 and the reflective housing 9 from being peeled off.

Moreover, the first wiring portion 211-1 of the first metallic pad 21 and the second to fifth wiring portions 232-2~232-5 of the third metallic pads 23 are arranged in one row along the first direction L1 and spaced apart from each other. The fifth bonding portion 221-5 of the second metallic pad 22 and the first to fourth bonding portions 231-1~231-4 of the third metallic pads 23 are arranged in another row along the first direction L1 and spaced apart from each other. The wiring portions 211-1, 232-2, 232-3, 232-4, 232-5 and the bonding portions 231-1,231-2, 231-3, 231-4, 221-5 are arranged along a second direction L2 perpendicular to the first direction L1, and a gap 24 having at least one corner is formed between the corresponding wiring portions 211-1, 232-2, 232-3, 232-4, 232-5 and the corresponding bonding portions 231-1, 231-2, 231-3, 231-4, 221-5. Specifically, each of the gaps 24 in the present embodiment is formed in a W shape, but the present disclosure is not limited thereto.

Five vertical LED chips 4 used in the present embodiment are respectively mounted on the bonding portions 231-1, 231-2, 231-3, 231-4, 221-5 and respectively and electrically connected to the wiring portion 211-1, 232-2, 232-3, 232-4, 232-5 Moreover, five Zener chips 5 are respectively mounted on the bonding portions 231-1,231-2, 231-3, 231-4, 221-5 the second bonding portion 231-2, the third bonding portion 231-3, the fourth bonding portion 231-4, and the fifth bonding portion 221-5, and the five LED chips 4 are respectively and electrically connected to the first wiring portion 211-1, 232-2, 232-3, 232-4, 232-5. Specifically, each set of the soldering pads 31 includes a negative soldering pad 311 electrically connected to the respective bonding portion 231-1,231-2, 231-3, 231-4, 221-5 through the conductive pillars 13 and a positive soldering pad 312 electrically connected to the respective wiring portion 211-1, 232-2, 232-3, 232-4, 232-5 through the conductive pillars 13.

Figure 5:
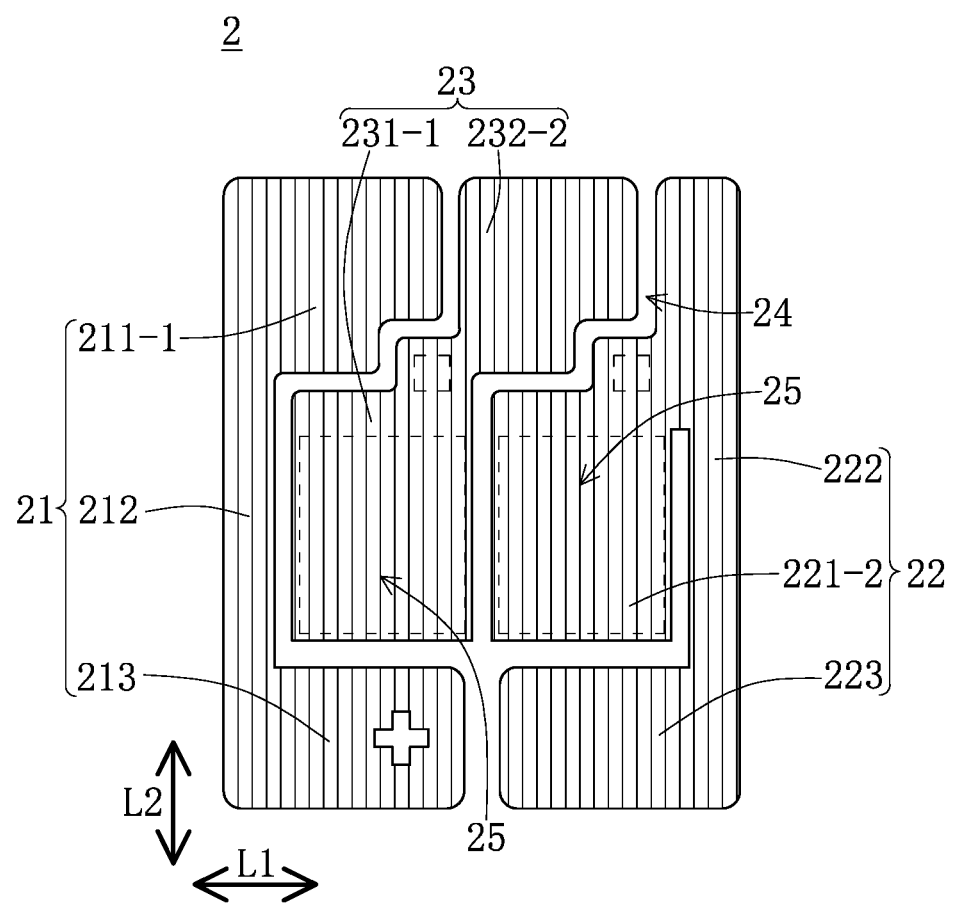
FIG. 5 is a planar view showing the electrode layer in another configuration.

In addition, the number of the third metallic pads 23 of the electrode layer 2 can be adjusted according to the number of the LED chips 4. For example, as shown in FIG. 5, the LED package structure 100 includes two LED chips 4, so that the electrode layer 2 of the LED package structure 100 includes the first metallic pad 21, the second metallic pad 22, and a single third metallic pad 23 arranged between the first metallic pad 21 and the second metallic pad 22. The structure and connection relationships of the components of the electrode layer 2 as shown in FIG. 5 are similar to those of the corresponding components of the electrode layer 2 as shown in FIG. 4.

Specifically, as shown in FIG. 5, the wiring portion 211 of the first metallic pad 21 can be defined as a first wiring portion 211-1. The wiring portion 232 of the third metallic pad 23 can be defined as a second wiring portion 232-2. The bonding portion 231 of the third metallic pad 23 can be defined as a first bonding portion 231-1. The bonding portion 221 of the second metallic pad 22 can be defined as a second bonding portion 221-2.

Accordingly, the LED chips 4 can be electrically connected in series by the arrangement of the electrode layer 2. Each set of the soldering pads 31 of the soldering layer 3 is provided in an electrically independent arrangement, so that each set of the soldering pads 31 can be used to control the corresponding LED chip 4 independently. That is to say, each of the LED chips 4 can be independently controlled by using the corresponding set of the soldering pads 31 that is to be applied to an adaptive front lighting system (AFS).

Figure 6:
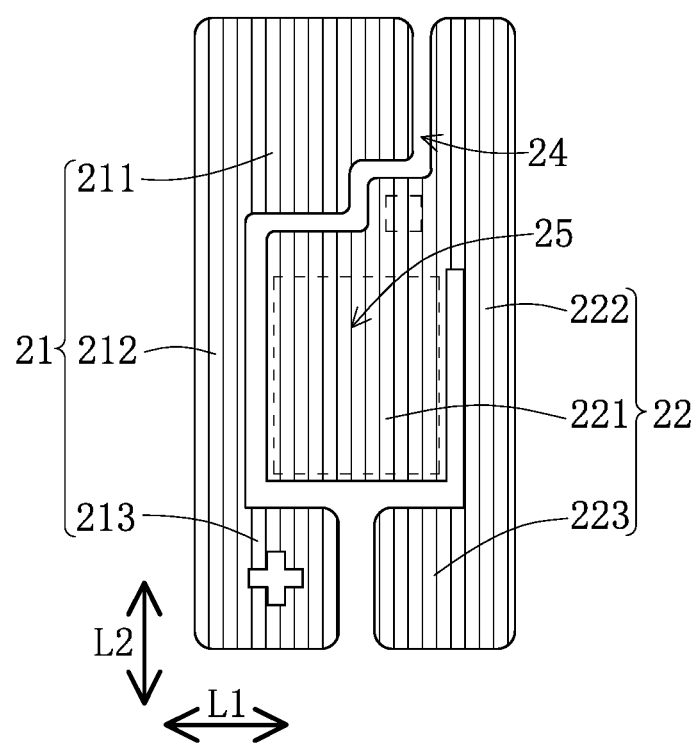
FIG. 6 is a planar view showing the electrode layer in the other configuration.

Moreover, as shown in FIG. 6, which shows the LED package structure 100 with only one LED chip 4 disposed thereon. Thus, the electrode layer 2 is provided without any third metallic pad 23. Specifically, the electrode layer 2 includes the first metallic pad 21 and the second metallic pad 22 arranged adjacent to the first metallic pad 21. The LED chip 4 is mounted on the bonding portion 221 of the second metallic pad 22 and is electrically connected to the wiring portion 211 of the first metallic pad 21 by a wire.

In other words, the microstructures 25 shown in FIG. 4 to FIG. 6 are substantially the same, but the present disclosure is not limited thereto. In addition, since the electrode layer 2 shown in FIG. 6 includes only one bonding portion 221, the first direction L1 can be defined by the arrangement of the first metallic pad 21 and the second metallic pad 22; or a direction substantially perpendicular to the microstructure 25 is defined as the first direction L1, and a direction substantially parallel to the microstructure 25 is defined as the second direction L2.

Accordingly, the LED chips 4 can be electrically connected in series by the arrangement of the electrode layer 2. Each set of the soldering pads 31 of the soldering layer 3 is provided in an electrically independent arrangement, so that each set of the soldering pads 31 can be used to control the corresponding LED chip 4 independently. That is to say, each of the LED chips 4 can be independently controlled by using the corresponding set of the soldering pads 31 that is to be applied to an adaptive front lighting system (AFS). At least three side edges of each of the LED chips 4 are flush with at least three edges of the corresponding bonding portion 221, 231.

Figure 7:
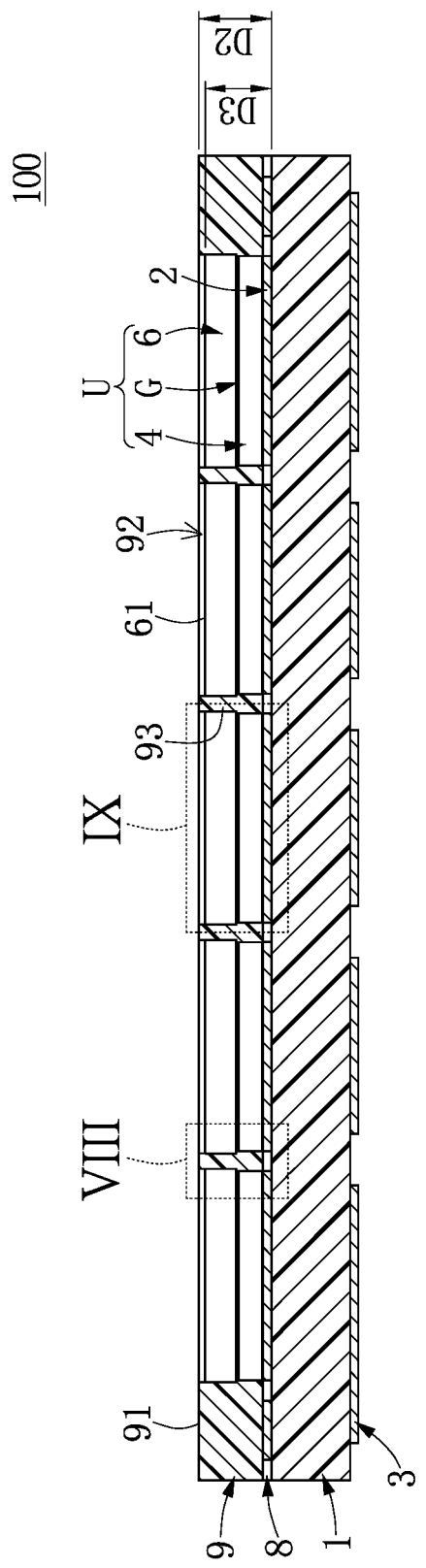
FIG. 7 is a cross-sectional view taken along line VII-VII of FIG. 1.
Figure 8:
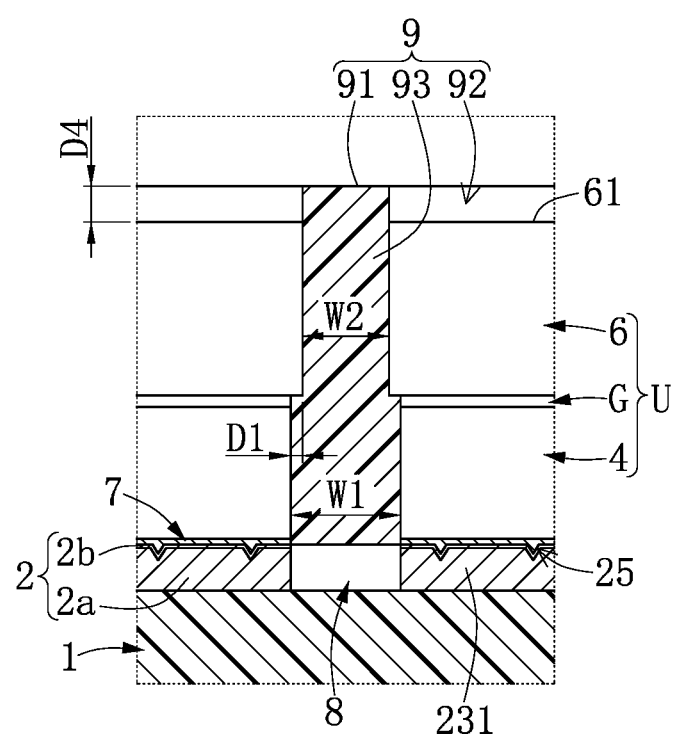
FIG. 8 is an enlarged view of portion VIII of FIG. 7.

As shown in FIG. 2, FIG. 7, and FIG. 8, the phosphor plate 6 in the present embodiment can be phosphor in glass (PiG) or phosphor in ceramic (PiC). A top surface of the LED chip 4 is substantially covered by the phosphor plate 6, and at least one side edge of the phosphor plate 6 protrudes from the LED chip 4 at a distance D1 that is within a range of 5-10 μm. The phosphor plate 6 has a light emitting surface 61 arranged away from the LED chip 4. And the reflective housing 9 is disposed on the electrode layer 2 and the insulating layer 8. The reflective housing 9 and the insulating layer 8 in the present embodiment are integrally formed as one single piece structure, but the present disclosure is not limited thereto. The reflective housing 9 surrounds and covers the side surfaces of each light-emitting unit U (i.e., the side surfaces of each of the LED chips 4 and/or the side surfaces of each of the phosphor plates 6), and the Zener chips 5 are embedded in the reflective housing 9, thereby preventing the Zener chips 5 from blocking light generated from the LED chips 4. The side surfaces of each of the LED chips 4 are flush with a plurality of inner walls of the reflective housing 9 so as to expose a respective light emitting surface of each of the light-emitting units U, such as a top surface of the LED chips 4. Furthermore, the reflective housing 9 has a plurality of openings 92 recessed in a top plane 91 thereof so as to respectively expose the light emitting surfaces 61 of the phosphor plates 6. The side surfaces of the phosphor plate 6 are preferably flush with the plurality of inner walls of the reflective housing 9 defining the corresponding opening 92.

Specifically, a distance D2 between the top plane 91 of the reflective housing 9 and the first surface 11 of the substrate 1 is larger than a distance D3 between the light emitting surface 61 of each of the phosphor plates 6 and the first surface 11 of the substrate 1. A distance D4 between the top plane 91 of the reflective housing 9 and the light emitting surface 61 of each of the phosphor plates 6 is substantially within a range of 10-30 μm. In addition, in other embodiments of the present disclosure, the top plane 91 of the reflective housing 9 can be coplanar with the light emitting surface 61 of each of the phosphor plates 6.

Moreover, a portion of the reflective housing 9 arranged between any two adjacent light-emitting units U is defined as a spacer 93 with an inverted T-shaped cross-section. A lower portion of the spacer 93 arranged adjacent to the insulating layer 8 has a width W1, which is larger than a width W2 of an upper portion of the spacer 93 arranged away from the insulating layer 8. In other words, the light-emitting unit U also has a T-shaped cross-section. Moreover, each of the spacers 93 of the reflective housing 9 is an inverted T-shaped structure, which has a narrow upper portion and a wide lower portion, and each of the openings 92 of the reflective housing 9 corresponds in shape to the phosphor plate 6, so that a blue light leakage problem of the LED package structure 100 can be avoided.

Figure 9:
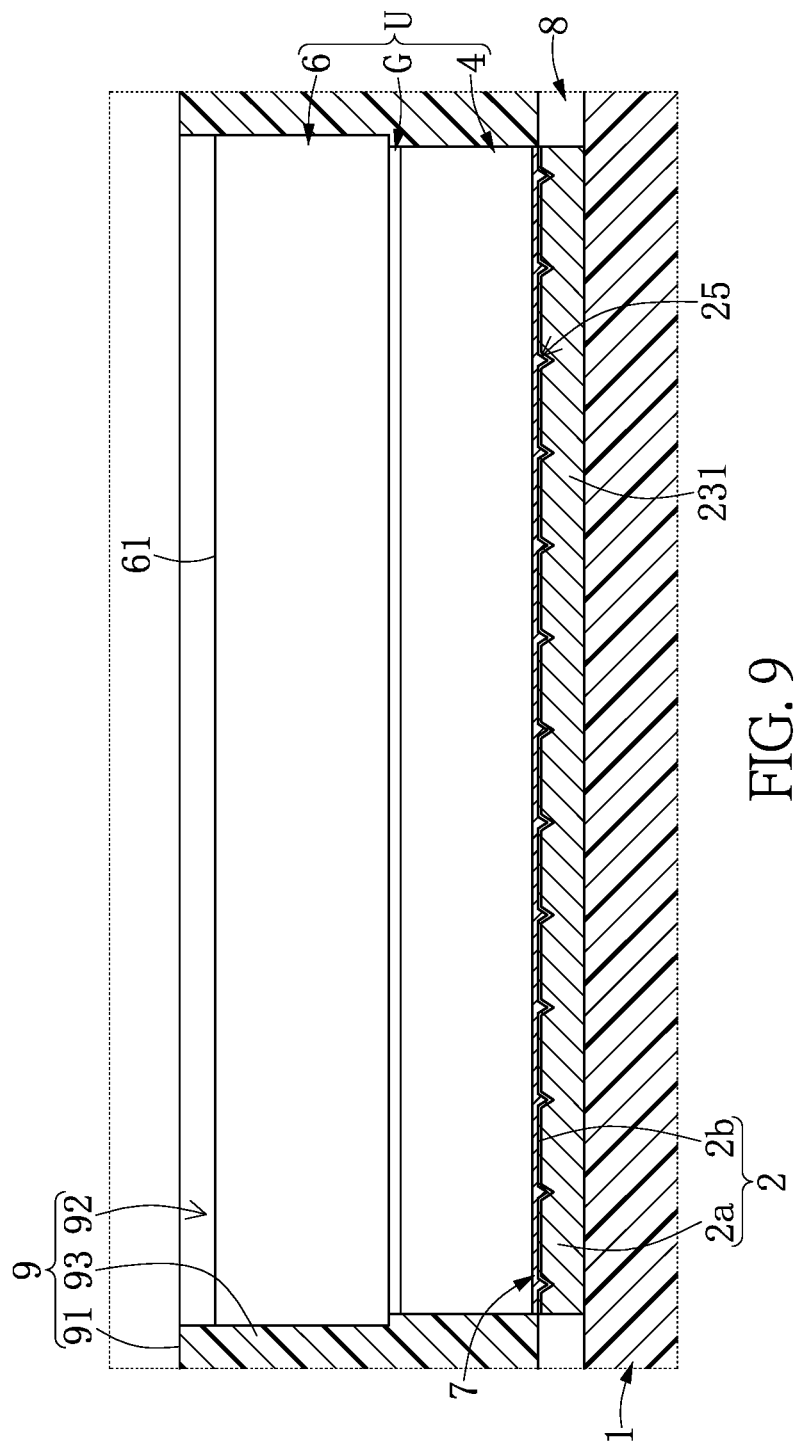
FIG. 9 is an enlarged view of portion IX of FIG. 7.

Moreover, as shown in FIG. 9, each of the LED chips 4 and the corresponding functional portion 231, 221 are connected to each other through the soldering material 7, and at least part of each of the microstructures 25 of the corresponding functional portion 231, 221 is filled with the soldering material 7. Accordingly, the microstructures 25 of the electrode layer 2 of the carrier can receive a part of the soldering material 7, thereby effectively preventing the soldering material 7 from flowing to portions of the electrode layer 2 other than the functional portions 231, 221.

In addition, as shown in FIG. 10 to FIG. 13, the carrier can further include a plurality of elongated accommodating holes 26 recessed in the surface of each of the functional portions 231, 221 (i.e., the surface of each of the functional portions 231, 221 formed with the microstructures 25). Each of the accommodating holes 26 is substantially parallel to each of the microstructures 25, and a depth of each of the accommodating holes 26 is larger than a depth of each of the microstructures 25. Each of the accommodating holes 26 has a width W3 along a direction perpendicular to a longitudinal direction of the corresponding accommodating hole 26, the width W3 of each of the accommodating holes 26 is larger than a width of each of the microstructures 25, and the width W3 is preferably within a range of 80-150 µm.

Specifically, each of the functional portions 231, 221 has a plurality of inner walls that respectively define the accommodating holes 26, and each of the inner walls includes two long side walls 261 and two end walls 262. An edge of each of the functional portions 231, 221 is spaced apart from one of the long side walls 261 adjacent thereto by a distance T1 that is equal to or less than 200 µm, and the edge of each of the functional portions 231, 221 is spaced apart from one of the end walls 262 adjacent thereto by a distance T2 that is equal to or less than 100 µm.

Figure 10:
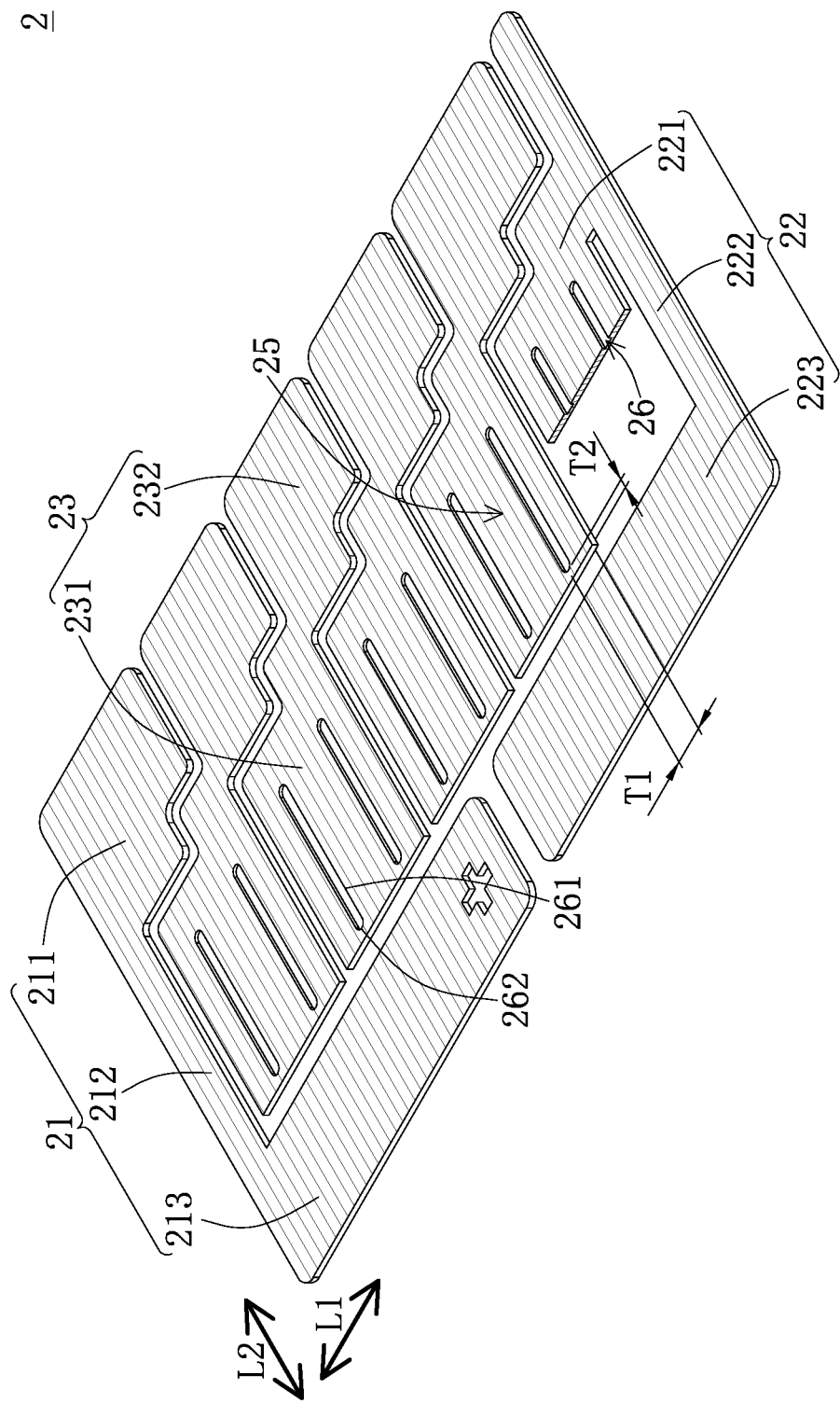
FIG. 10 is a perspective view of the electrode layer having a plurality of accommodating holes.
Figure 11:
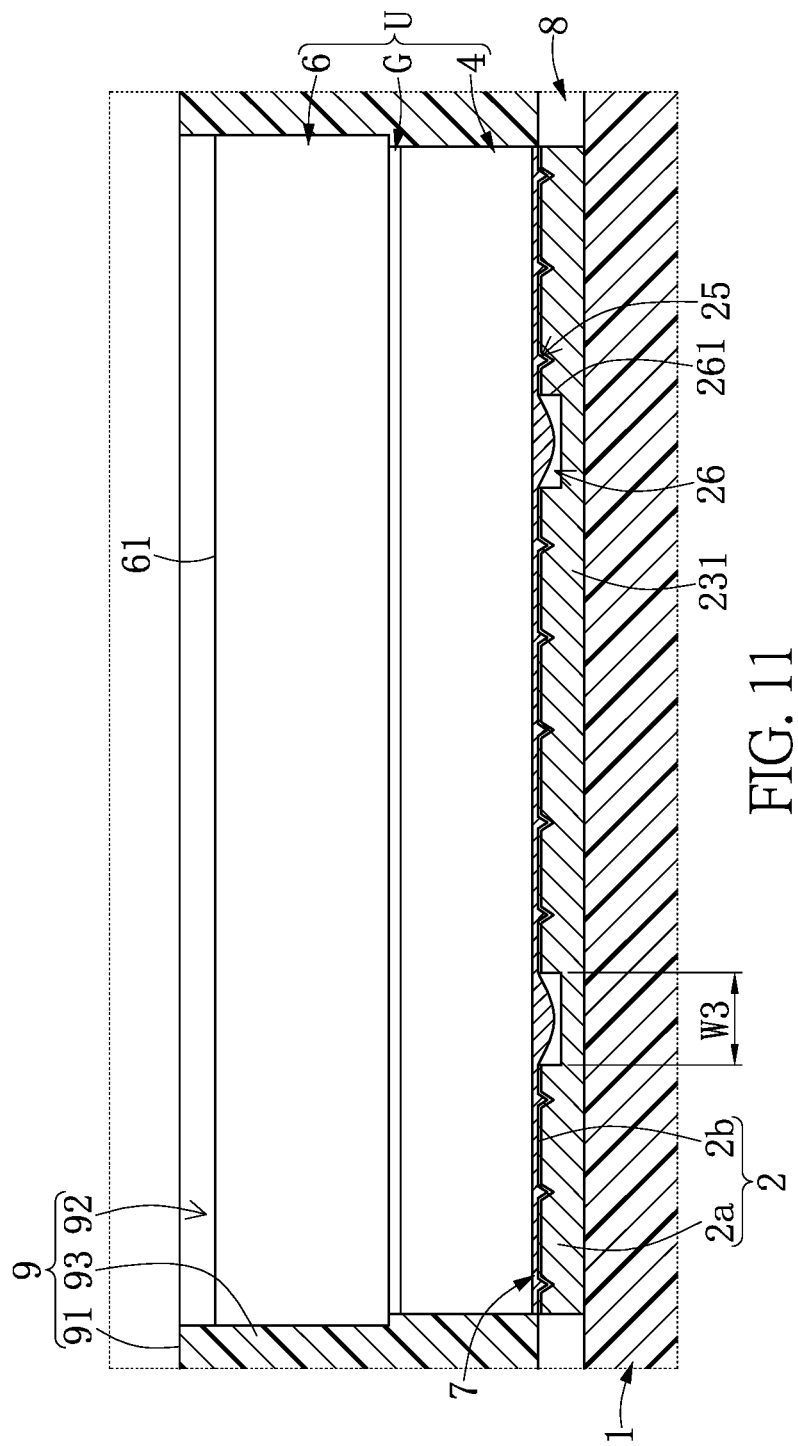
FIG. 11 is a cross-sectional view of the LED package structure having the electrode layer of FIG. 10.
Figure 12:
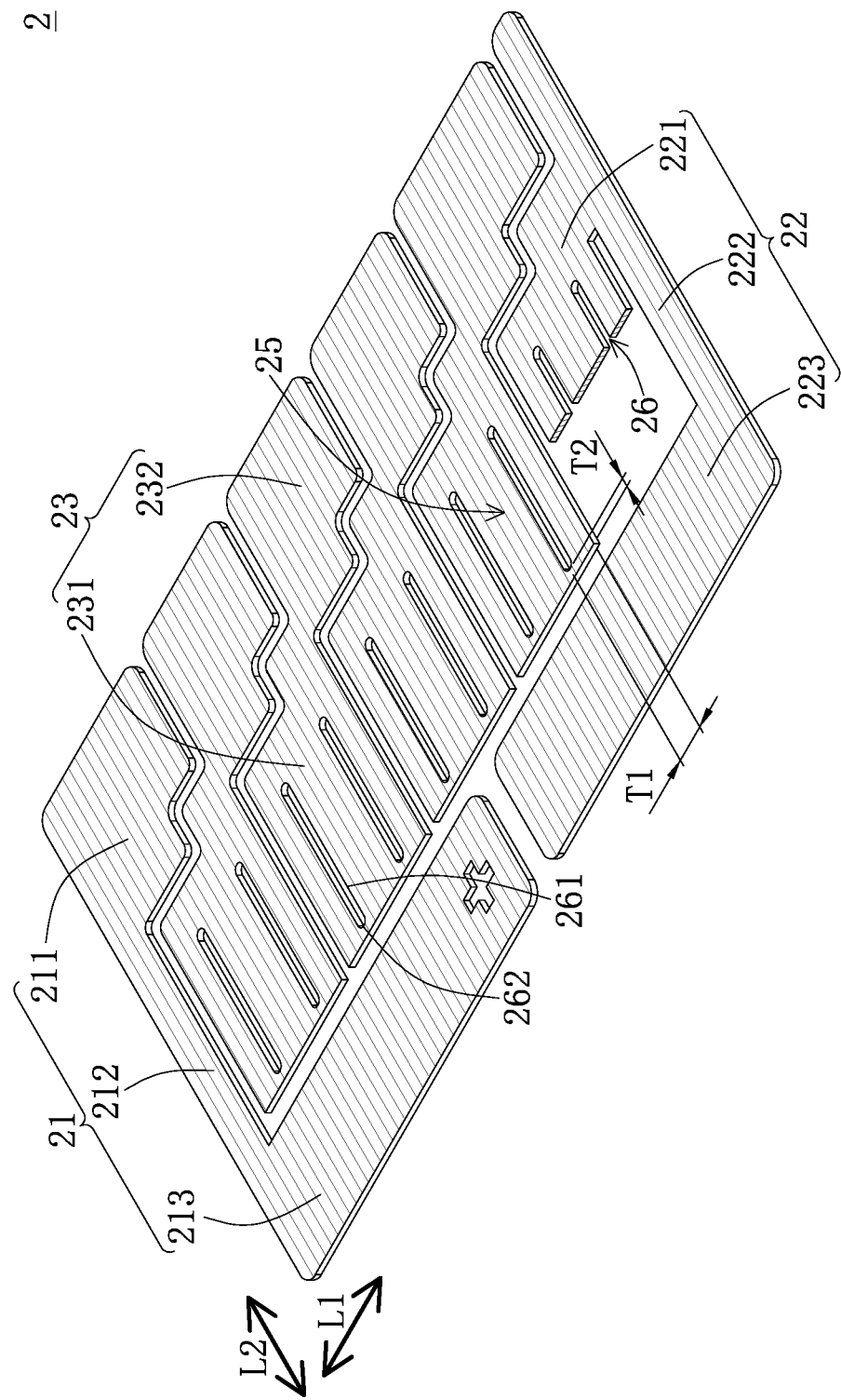
FIG. 12 is a perspective view of the electrode layer having the accommodating holes in another configuration.
Figure 13:
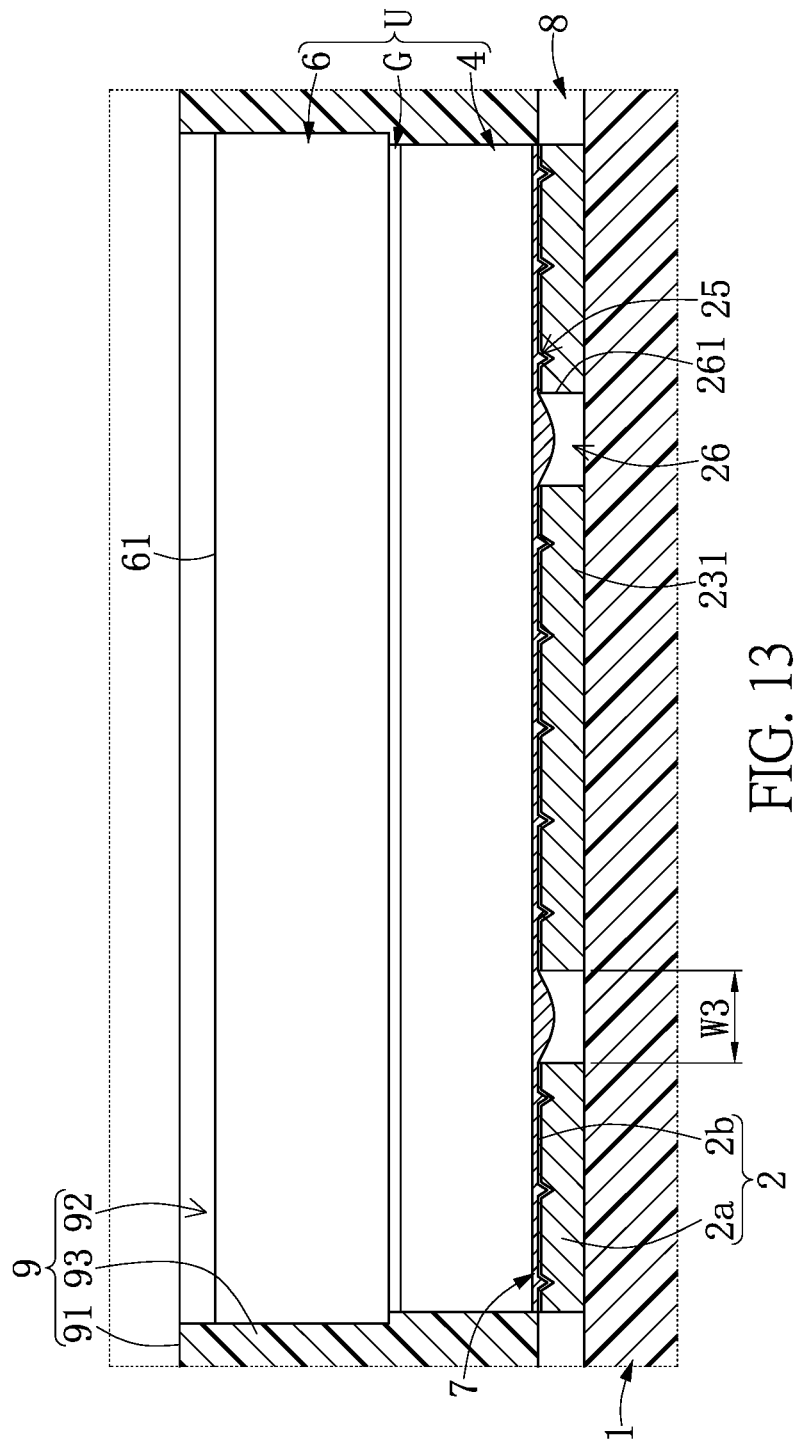
FIG. 13 is a cross-sectional view of the LED package structure having the electrode layer of FIG. 12.
Figure 14:
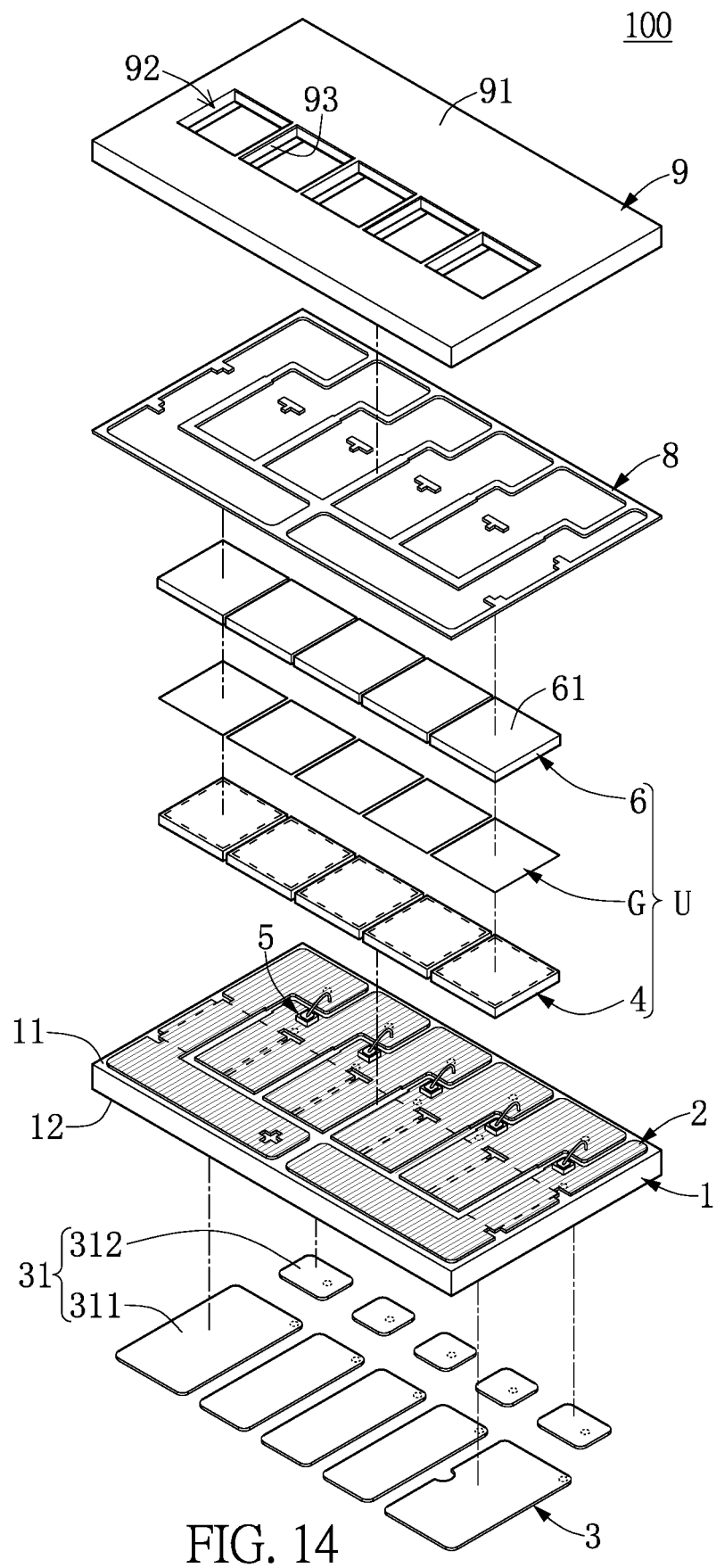
FIG. 14 is an exploded view of the LED package structure according to another embodiment of the present disclosure.

Moreover, in each of the functional portions 231, 221, at least part of each of the accommodating holes 26 is filled with the soldering material 7, and the depth of each of the accommodating holes 26 can be adjusted according to design requirements. For example, as shown in FIG. 12 and FIG. 13, each of the accommodating holes 26 penetrates the corresponding functional portion 231, 221, a portion of the soldering material 7 in each of the accommodating holes 26 has a filling depth that is less than 50% of the depth of each of the accommodating holes 26. As shown in FIG. 10 and FIG. 11, each of the accommodating holes 26 is a blind-hole having a depth within a range of 50-100 µm, and each of the accommodating holes 26 is fully filled with the soldering material 7, but the present disclosure is not limited thereto In addition, the LED package structure 100 in the present embodiment is shown as FIG. 1 to FIG. 3, but it is not limited thereto. For example, the LED chip 4 of the LED package structure 100 can be a flip chip as shown in FIG. 14, or the number of the LED chip 4 of the LED package structure 100 can be only one (as shown in FIG. 6) or two (as shown in FIG. 5). Moreover, other components of the LED package structure 100, such as Zener chip 5, can be adjusted according to the number of the LED chip 4.

Figure 15:
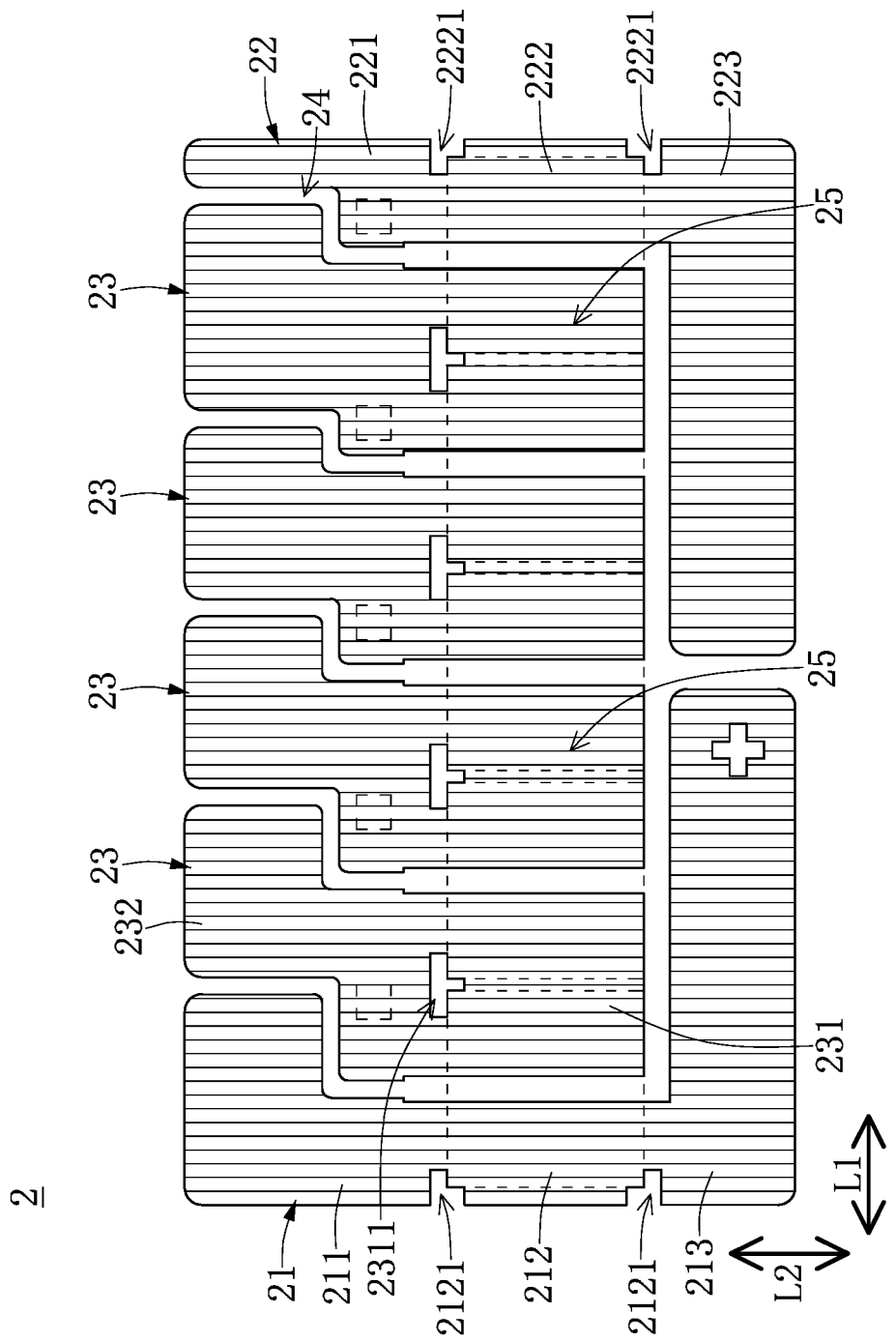
FIG. 15 is a planar view of the electrode layer of the LED package structure shown in FIG. 14.

As shown in FIG. 15, the electrode layer 2 includes a first metallic pad 21, a second metallic pad 22, and four third metallic pads 23 arranged between the first metallic pad 21 and the second metallic pad 22. The first metallic pad 21 has an L-shaped functional portion 211, a rectangular first extending portion 212, and a rectangular first electrode portion 213. The second metallic pad 22 has an L-shaped functional portion 221, a rectangular second extending portion 222, and a rectangular second electrode portion 223. Each of the first extending portion 212 and the second extending portion 222 has two L-shaped slots 2121, 2221. The third metallic pads 23 each have a substantial S-shape, and the third metallic pads 23 are spaced apart from each other. An upper portion 232 of each of the third metallic pads 23 is for wiring one of the Zener chips 5, and a lower portion 231 of each of the third metallic pads 23 is for mounting one of the LED chips 4 and another one of the Zener chips 5. The lower portion of each of the third metallic pads 23 further has a T-shaped slot 2311. It should be noted that each of the LED chips 4 in the present embodiment as shown in FIG. 14 and FIG. 15 is flipped on two adjacent metallic pads 21, 22, 23 via the soldering material 7. Specifically, the first LED chip 4 counted from the left side of FIG. 14 is flipped on a bonding portion which is defined as the rectangular first extending portion 212 of the first metallic pad 21 and the lower portion 231 of the adjacent third metallic pad 23. Each of the second, third, and fourth LED chips 4 is flipped on another three bonding portions which is defined as the lower portions 231 of any two adjacent third metallic pads 23. The fifth LED chip 4 is straddled across the second metallic pad 22 and the adjacent third metallic pad 23 and mounted on the other one bonding portion which is defined as the rectangular second extending portion 222 of the second metallic pad 22 and the lower portion 231 of the adjacent third metallic pad 23. The L-shaped slots 2121, 2221 and the T-shaped slots 2311 are provided for positioning the LED chips 4. A plurality of elongated microstructures 25 are formed on the surface of these bonding portions of the electrode layer 2 so as avoiding short circuit issue due to the flow of soldering material 7.

The bonding portions of the electrode layer 2 are arranged in one row along the first direction L1, the microstructures 25 are substantially parallel to each other, and each of the microstructures 25 is substantially perpendicular to the first direction L1. The surface of each of the bonding portions has an arithmetical mean deviation (Ra) within a range of 0.2-3.5 µm and a ten point height of irregularities (Rz) within a range of 0.8-2.0 µm by forming the microstructures 25. Moreover, in the present embodiment, each of the microstructures 25 is in a straight shape and is substantially perpendicular to the first direction L1. However, in other embodiments of the present disclosure, the microstructure 25 can be in a wave-like shape with a longitudinal direction substantially perpendicular to the first direction L1.

Figure 16:
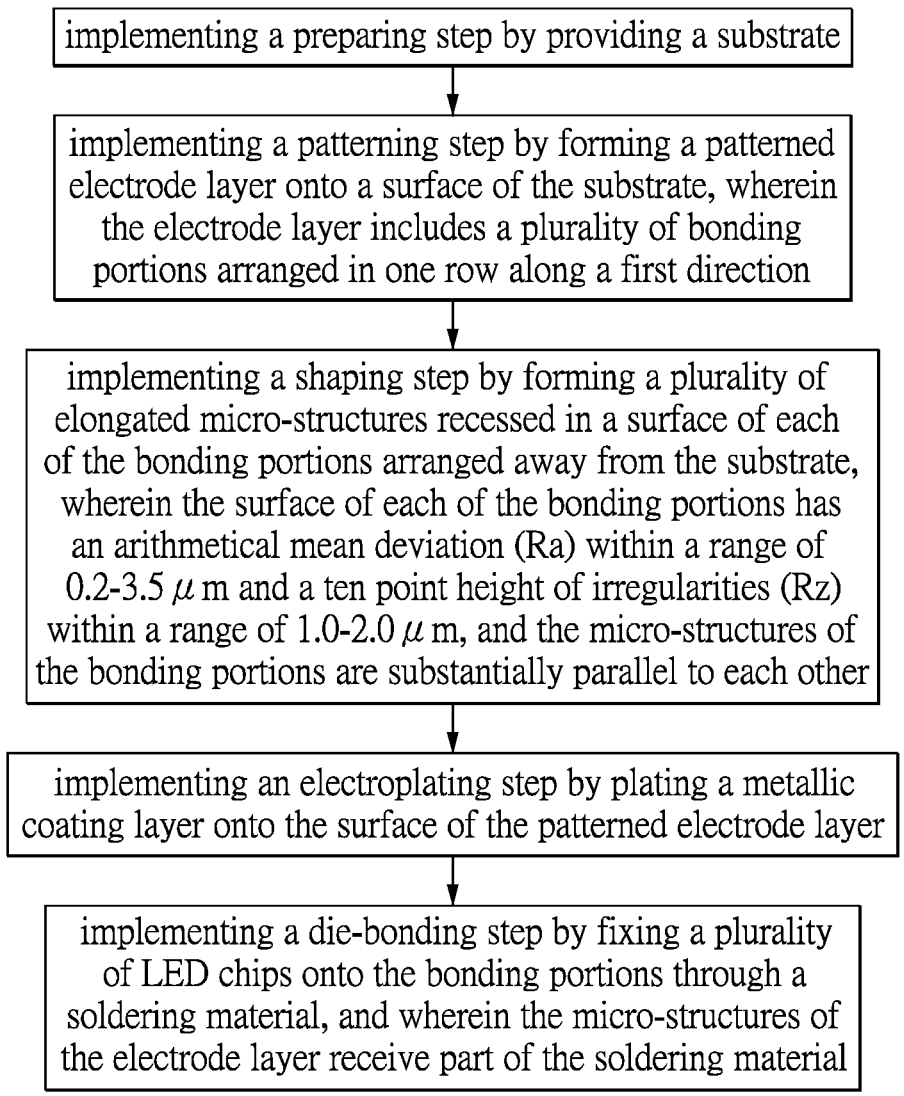
FIG. 16 is a flowchart of a method for manufacturing a carrier according to the present disclosure.

Referring to FIG. 16, which is to be read in conjunction with other drawings of the present embodiment, the present disclosure also discloses a method for manufacturing a carrier. The method of the present embodiment includes a preparing step that is implemented by providing the substrate 1, a patterning step, a shaping step, and an electroplating step. The structural features of the carrier are disclosed in the above description, and will not be reiterated herein.

It should be noted that the carrier can be manufactured by implementing the above steps of the method of the present embodiment, but the present disclosure is not limited thereto. In other words, in other embodiments of the present disclosure, the carrier can be manufactured by other methods. In addition, the LED package structure 100 of the present embodiment can also be manufactured by using the method of the present embodiment. That is to say, the present embodiment also discloses a manufacturing method of an LED package structure that includes the method for manufacturing the carrier.

Specifically, the patterning step is implemented by forming a patterned electrode layer 2 onto a surface of the substrate 1. The electrode layer 2 includes a plurality of bonding portions 231, 221 arranged in one row along a first direction L1, and the electrode layer 2 in the patterning step is a copper layer 2a shown in FIG. 8. Moreover, the patterning step can be implemented by further forming a plurality of elongated accommodating holes 26 recessed in a surface of each of the bonding portions 231, 221. In addition, the electrode layer 2 shown in FIG. 6 includes a single bonding portion 221, and the definition of the first direction L1 is disclosed in the above description, and will not be reiterated herein.

The shaping step is implemented by forming a plurality of elongated microstructures recessed in the surface of each of the bonding portions 231, 221 arranged away from the substrate 1, and the surface of each of the bonding portions 231, 221 has an arithmetical mean deviation (Ra) within a range of 0.2-3.5 µm and a ten point height of irregularities (Rz) within a range of 0.8-2.0 µm. The microstructures 25 of the bonding portions 231, 221 are substantially parallel to each other, and are preferably perpendicular to the first direction L1. Moreover, each of the accommodating holes 26 is substantially parallel to each of the microstructures 25, and a depth of each of the accommodating holes 26 is larger than a depth of each of the microstructures 25.

It should be noted that, in the shaping step of the present embodiment, the microstructures 25 of the bonding portions 231, 221 are formed by a brush manner, a pumice manner, or a micro-etch manner, but the present disclosure is not limited thereto.

The electroplating step is implemented by plating at least one metallic coating layer 2b onto the surface of the patterned electrode layer 2 with the microstructures 25. Specifically, the metallic coating layer 2b can be a nickel layer for isolation and migration, a gold layer for increasing quality of signal transmission, a nickel-gold multi-layer, or an alloy layer. In other words, the electrode layer 2 of the present embodiment can include the copper layer 2a and the metallic coating layer 2b formed on the copper layer 2a.

In addition, the method of the present embodiment can further include (or be applied to) a die-bonding step. Specifically, as shown in FIG. 11, the die-bonding step is implemented by fixing a plurality of LED chips 4 onto the bonding portions 231, 221 through a soldering material 7. The microstructures 25 and the accommodating holes 26 of the electrode layer 2 can receive part of the soldering material 7, thereby preventing the soldering material 7 from flowing to portions of the electrode layer 2 other than the bonding portions 231, 221. Accordingly, a short circuit problem brought about by the soldering material 7 can be avoided.

In conclusion, the LED package structure, the carrier, and the method of the present embodiment include the following advantages.

1. The microstructures or the accommodating holes of the electrode layer can receive part of the soldering material, thereby preventing the soldering material from flowing to portions of the electrode layer other than the bonding portions. Accordingly, a short circuit problem brought about by the soldering material can be avoided.
2. The surface of each of the bonding portions is formed with an arithmetical mean deviation (Ra) within a range of 0.2-3.5 μm and a ten point height of irregularities (Rz) within a range of 0.8-2.0 μm, thereby allowing controlling the roughness in consistency.
3. The bonding portions of the electrode layer uses the micro structures to further connect the soldering material, thereby effectively increasing the binding force between each of the LED chips and the corresponding bonding portion of the electrode layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A carrier, comprising:
    a substrate; and
    an electrode layer disposed on a surface of the substrate and including a plurality of metallic pads, wherein at least one of the metallic pads has a bonding portion configured to fix at least one light emitting chip,
    wherein the bonding portion has a plurality of elongated microstructures recessed in a surface thereof arranged away from the substrate, and the surface of the bonding portion has an arithmetical mean deviation (Ra) within a range of 0.2-3.5 μm and a ten point height of irregularities (Rz) within a range of 0.8-2.0 μm.
2. The carrier according to claim 1, wherein the number of the metallic pads having the bonding portion is at least two, and the bonding portions of the at least two metallic pads are arranged in one row along a first direction; and in each of the bonding portions, each of the microstructures is in a straight shape and is substantially perpendicular to the first direction.
3. The carrier according to claim 1, wherein the bonding portion has a plurality of elongated accommodating holes recessed in the surface thereof, each of the accommodating holes is substantially parallel to each of the microstructures, and a depth of each of the accommodating holes is larger than a depth of each of the microstructures.
4. The carrier according to claim 3, wherein each of the accommodating holes has a width that is in a direction perpendicular to a longitudinal direction of the corresponding accommodating hole, and the width of each of the accommodating holes is within a range of 80-150 μm.
5. The carrier according to claim 3, wherein the bonding portion has a plurality of inner walls that respectively define the accommodating holes, each of the inner walls includes two long side walls and two end walls, an edge of the bonding portion is spaced apart from one of the long side walls adjacent thereto by a distance that is equal to or less than 200 μm, and the edge of the bonding portion is spaced apart from one of the end walls adjacent thereto by a distance that is equal to or less than 100 μm.
6. The carrier according to claim 1, wherein the at least one of the metallic pads has a wiring portion integrally connected to the bonding portion thereof, and wiring portion has a plurality of elongated microstructures recessed in a surface thereof arranged away from the substrate, and wherein the number of the metallic pads having the bonding portion and the wiring portion is at least two, and the bonding portions of the at least two metallic pads are arranged in one row along a first direction; and in each of the wiring portions, each of the microstructures is in a straight shape and is substantially perpendicular to the first direction.
7. A light emitting diode (LED) package structure, comprising:
    a carrier according to claim 1;
    an insulating layer disposed on the surface of the substrate, wherein the insulating layer is shape-complementary to and coplanar with the electrode layer;
    at least one light-emitting unit mounted on the bonding portion of the electrode layer of the carrier; and
    a soldering material connected to the at least one light-emitting unit and the bonding portion of the electrode layer, wherein at least part of each of the microstructures is filled with the soldering material.
8. The LED package structure according to claim 7, wherein the bonding portion has a plurality of elongated accommodating holes recessed in the surface thereof, each of the accommodating holes is substantially parallel to each of the microstructures, a depth of each of the accommodating holes is larger than a depth of each of the microstructures and partly filled with the soldering material.

9. The LED package structure according to claim 8, wherein a reflective housing disposed on the electrode layer and the insulating layer, wherein the reflective housing surrounds and covers at least one side surface of the at least one light-emitting unit, and a surface of the at least one light-emitting unit is exposed from the reflective housing so as to be defined as a light emitting surface of the LED package structure.

10. A carrier, comprising:
a substrate; and
an electrode layer disposed on a surface of the substrate and including a plurality of metallic pads, wherein at least one of the metallic pads has a bonding portion configured to fix at least one light emitting chip,
wherein the bonding portion has a plurality of elongated microstructures and a plurality of elongated accommodating holes, the microstructures and the accommodating holes are recessed in a surface of the bonding portion arranged away from the substrate, and a depth of each of the accommodating holes is larger than a depth of each of the microstructures.

11. The carrier according to claim 10, wherein the number of the metallic pads having the bonding portion is at least two, and the bonding portions of the at least two metallic pads are arranged in one row along a first direction; and in each of the bonding portions, each of the microstructures is in a straight shape and is substantially perpendicular to the first direction.

12. The carrier according to claim 10, wherein each of the accommodating holes is substantially parallel to each of the microstructures.

13. The carrier according to claim 12, wherein each of the accommodating holes has a width that is in a direction perpendicular to a longitudinal direction of the corresponding accommodating hole, and the width of each of the accommodating holes is within a range of 80-150 μm.

14. The carrier according to claim 12, wherein the bonding portion has a plurality of inner walls that respectively define the accommodating holes, each of the inner walls includes two long side walls and two end walls, an edge of the bonding portion is spaced apart from one of the long side walls adjacent thereto by a distance that is equal to or less than 200 μm, and the edge of the bonding portion is spaced apart from one of the end walls adjacent thereto by a distance that is equal to or less than 100 μm.

15. The carrier according to claim 10, wherein the at least one of the metallic pads has a wiring portion integrally connected to the bonding portion thereof, and wiring portion has a plurality of elongated microstructures recessed in a surface thereof arranged away from the substrate, and wherein the number of the metallic pads having the bonding portion and the wiring portion is at least two, and the bonding portions of the at least two metallic pads are arranged in one row along a first direction; and in each of the wiring portions, each of the microstructures is in a straight shape and is substantially perpendicular to the first direction.

16. A light emitting diode (LED) package structure, comprising:
a carrier according to claim 10;
an insulating layer disposed on the surface of the substrate, wherein the insulating layer is shape-complementary to and coplanar with the electrode layer;
at least one light-emitting unit mounted on the bonding portion of the electrode layer of the carrier; and
a soldering material connected to the at least one light-emitting unit and the bonding portion of the electrode layer, wherein at least part of each of the microstructures and the accommodating holes are filled with the soldering material.

17. The LED package structure according to claim 16, wherein a reflective housing disposed on the electrode layer and the insulating layer, wherein the reflective housing surrounds and covers at least one side surface of the at least one light-emitting unit, and a surface of the at least one light-emitting unit is exposed from the reflective housing so as to be defined as a light emitting surface of the LED package structure.

18. A method for manufacturing a carrier, comprising:
implementing a preparing step by providing a substrate;
implementing a patterning step by forming a patterned electrode layer onto a surface of the substrate, wherein the electrode layer includes a plurality of bonding portions arranged in one row along a first direction; and
implementing a shaping step by forming a plurality of elongated microstructures recessed in a surface of each of the bonding portions arranged away from the substrate, wherein the surface of each of the bonding portions has an arithmetical mean deviation (Ra) within a range of 0.2-3.5 μm and a ten point height of irregularities (Rz) within a range of 0.8-2.0 μm, and the microstructures of the bonding portions are substantially parallel to each other.

19. The method according to claim 18, wherein in the shaping step, the microstructures of the bonding portions are formed by a brush manner, a pumice manner, or a micro-etch manner.

20. The method according to claim 18, wherein the patterning step is implemented by further forming a plurality of elongated accommodating holes recessed in the surface of each of the bonding portions, and wherein each of the accommodating holes is substantially parallel to each of the microstructures, and a depth of each of the accommodating holes is larger than a depth of each of the microstructures.

* * * * *